US012796153B2

(12) United States Patent
Von Malm et al.

(10) Patent No.: US 12,796,153 B2
(45) Date of Patent: Nov. 10, 2026

(54) OPTOELECTRONIC DEVICE WITH SURFACE EMITTER AND PHOTODIODE RECEIVERS ON A CARRIER

(71) Applicant: ams-OSRAM International GmbH, Regensburg (DE)

(72) Inventors: Norwin Von Malm, Thumhausen (DE); Martin Hetzl, Painten (DE); Horst Varga, Lappersdorf (DE); Tim Boescke, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 387 days.

(21) Appl. No.: 18/694,144

(22) PCT Filed: Aug. 17, 2022

(86) PCT No.: PCT/EP2022/072915
§ 371 (c)(1),
(2) Date: Mar. 21, 2024

(87) PCT Pub. No.: WO2023/046373
PCT Pub. Date: Mar. 30, 2023

(65) Prior Publication Data

US 2024/0387767 A1 Nov. 21, 2024

(30) Foreign Application Priority Data

Sep. 23, 2021 (DE) ..................... 10 2021 210 619.6

(51) Int. Cl.
*H10F 55/255* (2025.01)
*H10F 19/20* (2025.01)
(Continued)

(52) U.S. Cl.
CPC ........... *H10F 55/255* (2025.01); *H10F 19/20* (2025.01); *H10F 77/1248* (2025.01); *H10F 77/492* (2025.01)

(58) Field of Classification Search
CPC ......... H10F 55/25; H10F 77/50; H02M 3/335
See application file for complete search history.

(56) References Cited

U.S. PATENT DOCUMENTS 5,533,041 A * 7/1996 Matsuda .............. G02B 6/4246
257/E31.096
2014/0061679 A1 3/2014 Guo
(Continued)

FOREIGN PATENT DOCUMENTS

CN 107567671 A * 1/2018 ......... H01S 5/04257
CN 110112148 A * 8/2019 ........... H10D 86/021
(Continued)

OTHER PUBLICATIONS

Sagol, B. (Authorized officer), International Search Report and Written opinion dated Nov. 28, 2022 issued in PCT Application No. PCT/EP2022/072915, 15 pages (including English translation).
(Continued)

*Primary Examiner* — William B Partridge
*Assistant Examiner* — Felix B Andrews
(74) *Attorney, Agent, or Firm* — MH2 Technology Law Group LLP

(57) ABSTRACT

An optoelectronic device is specified having a transmitter which is designed to emit electromagnetic radiation and to be operated at an input voltage, a support for the transmitter, said support having a top surface and a bottom surface, a first receiver which is designed to receive at least part of the electromagnetic radiation and to supply at least part of an output voltage, wherein the transmitter comprises at least one surface emitter, the at least one surface emitter of the
(Continued)

transmitter is mounted on the top surface of the support and radiates at least part of the electromagnetic radiation through the support, the first receiver (3) comprises at least one photodiode, and the first receiver is arranged on the bottom surface of the support.

11 Claims, 3 Drawing Sheets

(51) Int. Cl.

| | |
|---|---|
| ***H10F 77/124*** | (2025.01) |
| ***H10F 77/42*** | (2025.01) |

(56) References Cited

U.S. PATENT DOCUMENTS

| | | | |
|---|---|---|---|
| 2016/0308085 | A1 | 10/2016 | Guter et al. |
| 2019/0222211 | A1 | 7/2019 | Yang et al. |
| 2021/0083141 | A1 | 3/2021 | Scheller et al. |

FOREIGN PATENT DOCUMENTS

| | | | | | |
|---|---|---|---|---|---|
| EP | 0084621 | A2 | | 8/1983 | |
| EP | 3082169 | A1 | * | 10/2016 | ............ H10W 90/00 |
| JP | H06347917 | A | * | 12/1994 | |
| TW | 1732207 | B | * | 7/2021 | ........... G06F 3/0421 |
| WO | 2022072122 | A1 | | 4/2022 | |

OTHER PUBLICATIONS

German Office Action issued in corresponding German Patent Application No. 10 2021 210 619.6, 39 pages.

Helmers Henning et al. "Integrated Power and Data Transceiver Devices for Power-By-Light Systems—A Concept Study" Proceedings of the 32th European Photovoltaic Solar Energy Conference, Jun. 20, 2016, Revised Jun. 24, 2016. pp. 218-222 DOI: 10.4229/EUPVSEC20162016-1B V.6.10 ISBN: 3-936338-41-8. XP040679623 abstract; figures 5, 6, 7, 8 p. 219-p. 221.

Wilkins Matthew M et al. "Ripple-Free Boost-Mode Power Supply Using Photonic Power Conversion" IEEE Transactions on Power Electronics, Institute of Electrical and Electronics Engineers, USA, vol. 34, No. 2, May 31, 2018 (May 31, 2018), pp. 1054-1064, [retrieved on Dec. 18, 2018] DOI: 10.1109/TPEL.2018.2843158 ISSN: 0885-8993, XP011701588.

* cited by examiner

OPTOELECTRONIC DEVICE WITH SURFACE EMITTER AND PHOTODIODE RECEIVERS ON A CARRIER

CROSS-REFERENCE TO RELATED APPLICATIONS

The present application is a national stage entry from International Application No. PCT/EP2022/072915, filed on Aug. 17, 2022, published as International Publication No. WO 2023/046373 A1 on Mar. 30, 2023, and claims priority to German Patent Application No. 10 2021 210 619.6, filed Sep. 23, 2021, the disclosures of all of which are hereby incorporated by reference in their entireties.

FIELD

An optoelectronic device is specified.

BACKGROUND

An object to be achieved is to specify an optoelectronic device which is particularly compact.

SUMMARY

In accordance with at least one embodiment of the optoelectronic device, the optoelectronic device comprises a transmitter configured to emit electromagnetic radiation and to be operated with an input voltage. The transmitter is for example a component which generates electromagnetic radiation in the wavelength range between infrared radiation and UV radiation. In particular, the transmitter may be configured to generate electromagnetic radiation in the wavelength range of at least 350 nm to at most 1100 nm, in particular in the wavelength range of at least 800 nm to at most 950 nm, during operation.

In accordance with at least one embodiment of the device, the device comprises a first receiver configured to receive at least part of the electromagnetic radiation and to supply at least part of an output voltage. The first receiver is configured in particular to receive at least part of the electromagnetic radiation emitted by the transmitter during operation and to convert at least part of the received electromagnetic radiation into electrical energy. In this case, the first receiver may be coordinated with the transmitter in particular in such a way that the first receiver comprises a particularly high absorption for the electromagnetic radiation generated by the transmitter. The optoelectronic device may comprise exactly one receiver. Furthermore, it is possible for the optoelectronic device to comprise second, third, fourth or more receivers.

In accordance with at least one embodiment of the optoelectronic device, the transmitter comprises at least one surface emitter. In the present case, a surface emitter is understood to mean a radiation-emitting component which radiates the electromagnetic radiation generated during operation transversely, in particular perpendicularly, with respect to a mounting surface on which the radiation-emitting component is mounted. In particular, the surface emitter may be a semiconductor component comprising an epitaxially grown semiconductor body. The direction in which the electromagnetic radiation is then radiated during operation may be in particular parallel to a growth direction of the semiconductor body. The semiconductor body may be based for example on semiconductor materials, such as In(Ga)N, In(Ga)AlP, (Al)GaAs, (In)GaAs.

The surface emitter may be for example a light-emitting diode or a laser diode, in particular a superluminescence diode or a VCSEL. In this case, the transmitter may contain a plurality of surface emitters, which may be interconnected in series and/or in parallel with one another. The input voltage of the transmitter is then correspondingly calculated from the voltages with which the surface emitters are operated.

In accordance with at least one embodiment of the optoelectronic device, the first receiver comprises at least one photodiode. The photodiode may comprise a semiconductor body comprising at least one detecting layer configured to absorb the electromagnetic radiation generated by the at least one surface emitter during operation and to convert it into electrical energy. The at least one photodiode may be constituted for example in the same material system as the at least one surface emitter or in a different material system. The receiver may comprise in particular a plurality of photodiodes, which may be interconnected in series and/or in parallel with one another. The output voltage of the receiver is then correspondingly calculated from the voltage dropped across the individual photodiodes.

In accordance with at least one embodiment of the optoelectronic device, the optoelectronic device comprises a carrier for the transmitter, which comprises a top surface and a bottom surface. The top surface is one main surface of the carrier, which may be formed as plane or flat, for example. The bottom surface is then a further main surface of the transmitter facing away from the top surface. The carrier may be a growth substrate for the at least one surface emitter of the transmitter. Furthermore, it is possible for the carrier not to be a growth substrate for the at least one surface emitter. The growth substrate may then also be removed and replaced by the carrier.

The carrier is the mechanically supporting component of the transmitter to which the at least one surface emitter of the transmitter is mechanically secured and by which the at least one surface emitter is mechanically supported.

In accordance with at least one embodiment of the optoelectronic device, the at least one surface emitter of the transmitter is secured to the top surface of the carrier and radiates at least part of the electromagnetic radiation generated during operation through the carrier. That means that the carrier is transmissive, in particular transparent, to the electromagnetic radiation generated.

In accordance with at least one embodiment of the optoelectronic device, the first receiver is arranged at the bottom surface of the carrier. In this case, the first receiver may be spaced apart from the bottom surface or the first receiver and the carrier are in direct contact with one another. For the case where the first receiver and the carrier are arranged spaced apart from one another, a mechanical connection between the first receiver and the carrier may be mediated via a housing, for example.

In accordance with at least one embodiment, the optoelectronic device comprises a transmitter configured to emit electromagnetic radiation and to be operated with an input voltage, a carrier for the transmitter, which comprises a top surface and a bottom surface, a first receiver configured to receive at least part of the electromagnetic radiation and to supply at least part of an output voltage. In this case, the transmitter comprises at least one surface emitter. The at least one surface emitter is secured to the top surface of the carrier and at least part of the electromagnetic radiation is radiated through the carrier. The first receiver comprises at least one photodiode and is arranged at the bottom surface of the carrier.

The optoelectronic device described here is based in this case on the following considerations, inter alia.

Many applications, such as, for example, in acoustics, in radiation control technologies such as, for instance, MEMS, actuators, detectors, such as avalanche photodiodes, single-photon avalanche diodes or photomultipliers, require high-voltage supplies with relatively low current consumption. Such applications may require voltages of more than 50 V, 100 V, 500 V, 1000 V, 2000 V, 10 000 V or more, while at the same time the intention is to maintain a small footprint of the device in regard to size, weight, costs and energy consumption. These properties are particularly important for mobile devices such as, for instance, AR-VR glasses, portable in-ear headphones and automotive applications.

A further problem to be solved in the case of high-voltage generators with a small space requirement is the connection of low- and high-voltage paths, which should be galvanically isolated in order to ensure the functional reliability and long-term stability of a device under changing ambient conditions such as temperature, moisture, dust.

In this case, the optoelectronic device described here may advantageously be used as, or be, an optical voltage transformer. Furthermore, the optoelectronic device described here makes it possible to convert a high voltage at the input side into a low voltage at the receiver. Furthermore, the present device enables an AC voltage to be transformed into a DC voltage, and vice versa. Finally, the present device also makes it possible to transfer energy from the transmitter side to the receiver side in a galvanically isolated manner, without a change in voltage taking place in the process.

The optoelectronic device described here may thus constitute for example a transformer which manages without inductive elements, in particular without coils. As a result, firstly, the installation space is particularly small in comparison with conventional transformers; secondly, strong magnetic fields do not arise during the transformation. As a result, influencing caused by external magnetic and/or electric fields is also precluded. Consequently, the optoelectronic device may be used in areas for which magnetic influencing would be critical or which are provided with high external magnetic fields. At the same time, the optical power transfer in the optoelectronic device ensures galvanic isolation of the high-voltage side and the low-voltage side.

By obviating the need to use switched elements, as is the case in boost or buck converters or would be necessary in the case of an inductive transformer, for example, it is possible for the output voltage generated to be free of disturbances. This may be the case in particular during use in measuring systems and/or monitoring systems in a very small space, which react sensitively to disturbances of the supply voltage.

For the case where the input voltage is greater than the output voltage, it is possible to exploit the fact that the power to be maximally drawn at the receiver side is directly proportional to the power fed in at the transmitter side. As a result, it is possible to monitor changes in current and voltage on the transmitter side. This may be used for example for the galvanically isolated monitoring of high voltages. On account of the nonlinear characteristic curve of the transmitter, in this case particularly well-defined pulses may be generated on the transmitter side, which is not the case for purely electronic solutions, for example in switched-mode power supplies.

A further concept of the device described here is to combine semiconductor light emitters and photodiodes, i.e. photovoltaic cells, in order to achieve a conversion from low voltage into high voltage. On the low-voltage path, for this purpose, for example, one or a plurality of surface emitting semiconductor lasers, light-emitting diodes or superluminescence diodes connected in parallel with one another emit light. The wavelength of the emitted light may be between 350 nm and 1100 nm, depending on the semiconductor materials used, for example: In(Ga)N, In(Ga)AlP, (Al)GaAs, (In)GaAs. Typical input voltages are 1 V, 3 V, 5 V, 8 V, 10 V or therebetween.

On the high-voltage side, which is galvanically isolated from the low-voltage side, an array of series-connected photodiodes operating in the photovoltaic mode collects the emitted light. Depending on the material used, for example Si, InGaAs, GaAs, InGaN or perovskite, each individual photodiode generates a voltage of the order of magnitude of 0.5-3 V and a current depending on the intensity of the incident light. Owing to the use of a large number of photodiodes, all of which may be connected in series on a very small wafer scale, these individual voltages add up to a high total voltage that may exceed 10 V, 50 V, 100 V, 500 V, 1000 V, 10 000 V.

Owing to the high output power of the transmitter, it is possible to use just a single surface emitter or a small number of surface emitters for illuminating the photodiodes, which reduces size and costs of the device on the transmitter side.

With a focused light cone of the surface emitters, it is also possible to compress the distance and the area of the receiver to a small scale.

Overall, the present device makes it possible to transfer energy and/or convert voltage in a particularly compact component. In this case, the optoelectronic device is insensitive to external influences such as electromagnetic fields, for example.

In accordance with at least one embodiment of the optoelectronic device, the input voltage is less than the output voltage and the first receiver and/or further receivers comprise(s) a plurality of photodiodes interconnected in series with one another. In this case, it is possible, for example, for the transmitter likewise to comprise a plurality of surface emitters, which are then interconnected in parallel with one another, for example. In particular, the input voltage of the transmitter is less than the output voltage of the first receiver or of the further receivers. The device is therefore configured to convert a low input voltage into a high output voltage. For this purpose, the first receiver and optionally the further receivers may comprise a plurality of photodiodes, for example at least 10 photodiodes, in particular at least 50 or at least 100 individual photodiodes. The output voltage may be adjusted in a simple manner by way of the number of photodiodes connected in parallel with one another.

In accordance with at least one embodiment of the optoelectronic device, the input voltage is greater than the output voltage and the transmitter comprises a plurality of surface emitters interconnected in series with one another. In this case, it is possible, in particular, for the optoelectronic device to comprise more surface emitters than photodiodes. Furthermore, it is possible for the device to comprise, at the first receiver and optionally the further receivers, a plurality of photodiodes interconnected at least partly in parallel with one another. This device makes it possible to convert a high input voltage into a lower output voltage.

In accordance with at least one embodiment of the optoelectronic device, the transmitter comprises two series circuits of surface emitters, which are interconnected antiparallel with one another. In this way, an AC voltage may be transformed into a DC voltage by the device. In particular, a high AC voltage may be transformed into a lower, optionally pulsed, DC voltage.

In accordance with at least one embodiment of the optoelectronic device, the device comprises further receivers configured to receive part of the electromagnetic radiation and to supply part of an output voltage, wherein each further receiver comprises at least one photodiode. In particular, each further receiver comprises a plurality of photodiodes. In this case, the individual receivers of the optoelectronic device may for example be constructed identically and each comprise an identical number of photodiodes. Depending on whether the input voltage is less than the output voltage or the input voltage is greater than the output voltage, the photodiodes of the individual receivers may be correspondingly interconnected with one another. For example, it is possible for the input voltage to be less than the output voltage and for the photodiodes of all the receivers to be interconnected in series with one another.

In accordance with at least one embodiment of the optoelectronic device, The optoelectronic device comprises a second receiver arranged at the top surface of the carrier. That is to say that, in this embodiment, the first receiver is arranged at the bottom surface of the carrier and the second receiver is arranged at the top surface of the carrier. The surface emitters of the transmitter then radiate electromagnetic radiation through the carrier to the first receiver and away from the carrier to the second receiver.

The surface emitters may then be in particular surface emitters that emit on both sides. The second receiver may be in direct contact with the surface emitters. Furthermore, it is possible for the second receiver and the transmitter to be arranged spaced apart from one another. In this case, it is possible for there to be a mechanical connection between the transmitter and the second receiver, which connection may be mediated by a housing, for example.

In accordance with at least one embodiment of the optoelectronic device, a third receiver and/or a fourth receiver and/or a fifth receiver and/or a sixth receiver are arranged laterally with respect to the transmitter. By way of example, it is possible for the transmitter to be arranged centrally. The first receiver is arranged below the transmitter, at the bottom surface of the carrier, and the second receiver is arranged above the carrier. The third receiver and/or the fourth receiver may then be arranged laterally next to the transmitter. The fifth and sixth receivers may be arranged in front of and behind the transmitter.

In this case, it is possible, in particular, for a beam splitter to be disposed downstream of the transmitter at the top surface and/or the bottom surface of the carrier. This beam splitter makes it possible to divert part of the electromagnetic radiation of the transmitter emitted at the top surface and/or the bottom surface to the third and/or fourth and/or fifth and/or sixth receiver and to divert part of the electromagnetic radiation to the first and/or second receiver. In this way, a particularly large number of photodiodes may be irradiated by a single transmitter and a particularly compact construction of the optoelectronic device is possible.

In accordance with at least one embodiment of the optoelectronic device, the first receiver is in direct contact with the carrier. In this way, electromagnetic radiation may be brought to the first receiver particularly efficiently through the carrier and the carrier may constitute a mechanically supporting component for the photodiodes of the first receiver. In this case, it is possible for the at least one photodiode of the first receiver to be bonded to the bottom surface of the carrier. The bonding may be effected by direct bonding, for example. Furthermore, it is possible for a cohesive connection between the carrier and the photodiodes of the first receiver to be constituted by a connecting material, such as an adhesive, for example. Said connecting material may simultaneously act as a light guide for guiding the electromagnetic radiation from the bottom surface of the carrier to a radiation entrance surface of the photodiodes.

Alternatively, it is possible for the at least one photodiode of the first receiver to be epitaxially grown on the bottom surface of the carrier. In this case, the carrier constitutes a growth substrate for the photodiodes of the first receiver.

In this case, it is also possible, in particular, alternatively or additionally for the at least one surface emitter of the transmitter to be epitaxially grown on the top surface of the carrier. In other words, the carrier then constitutes a growth substrate for the surface emitters of the transmitter. The carrier may then in particular also constitute a growth substrate for the surface emitters of the transmitter and the photodiodes of the first receiver. As a result, a particularly compact construction of the optoelectronic device is made possible and electromagnetic radiation may be guided from the surface emitters to the photodiodes particularly without losses. The optoelectronic device described here is explained in greater detail below on the basis of exemplary embodiments and with reference to the associated figures.

DETAILED DESCRIPTION

Elements that are identical, of identical type or act identically are provided with the same reference signs in the figures. The figures and the size relationships of the elements illustrated in the figures among one another should not be regarded as to scale. Rather, individual elements may be illustrated with an exaggerated size for clarity of presentation and/or for clarity of understanding.

Figure 1:
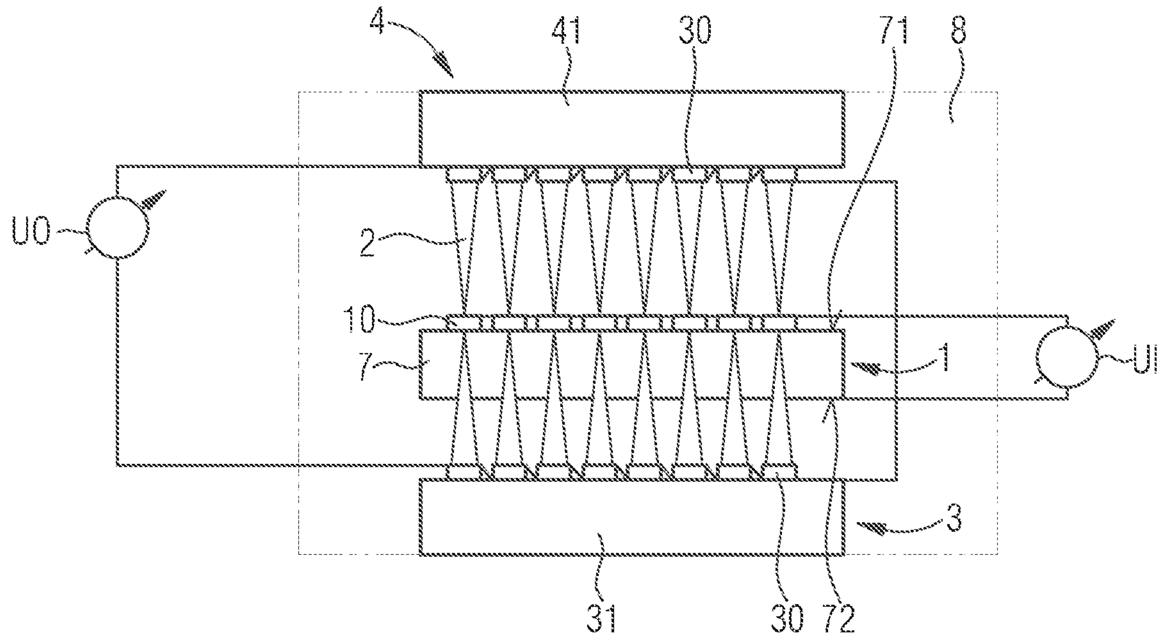
FIG. 1 schematically depicts an optoelectronic device according to an embodiment.

A first exemplary embodiment of an optoelectronic device described here is explained in greater detail in association with the schematic sectional illustration in FIG. 1.

The optoelectronic device comprises a transmitter 1 configured to emit electromagnetic radiation 2. For this purpose, the transmitter 1 is operated with an input voltage UI.

The transmitter 1 comprises a carrier 7 comprising a top surface 71 and a bottom surface 72, Furthermore, the optoelectronic device comprises a first receiver 3 configured to receive part of the electromagnetic radiation 2 of the transmitter 1 and to convert at least part of the received radiation into electric current. In this case, the first receiver 3 supplies part of the output voltage UO.

In the exemplary embodiment in FIG. 1, the transmitter comprises a plurality of surface emitters 10, which are each VCSEL chips, for example. The surface emitters are secured to the top surface 71 of the carrier 7. At least part of the electromagnetic radiation 2 is radiated through the carrier 7.

The first receiver 3 comprises a plurality of photodiodes 30 applied to a first carrier 31 and facing the bottom surface 72 of the carrier 7. As a result, the first receiver 3 is arranged at the bottom surface 72 of the carrier 7.

A second receiver 4 comprising a second carrier 41 for the photodiodes 30 is arranged at the top surface 71 of the carrier 7. In this case, the photodiodes 30 of the second receiver 4 face the surface emitters 10. The photodiodes 30 of the second 4 receiver are also configured to receive part of the electromagnetic radiation 2 and to supply part of the output voltage UO. By way of example, it is possible for all of the photodiodes 30 of the first receiver 3 and of the second receiver 4 to be interconnected in series with one another.

The first receiver 3 and the second receiver 4 may be constructed identically, for example. The first receiver 3 and the second receiver 4 are then structurally identical, for example. The transmitter 1, the first receiver 3 and the second receiver 4 may be arranged in a common housing 8, which may be filled with an electrically insulating material, such as a gas or transparent plastic material, for example.

In the exemplary embodiment in FIG. 1, the number of photodiodes 30 of the first receiver 3 corresponds to the number of surface emitters and the number of photodiodes 30 of the second receiver 4.

The transmitter 1 may be for example an array of VCSELs, which comprises VCSELs as surface emitters 10 that radiate the electromagnetic radiation on both sides, i.e. from their top side and their underside.

The first receiver 3 and the second receiver 4 are in each case a photodiode array. On account of the sharp and symmetrical beam profile of the electromagnetic radiation 2 of the individual surface emitters 10, each surface emitter 10 illuminates a respective photodiode of both receivers. The electromagnetic radiation 2 that reaches the second receiver 4 propagates through the material with which the housing 8 is filled. The electromagnetic radiation 2 that is radiated to the first receiver 3 is radiated through the carrier 7, which is formed so as to be transparent to the electromagnetic radiation 2.

In this case, the surface emitter 10 may comprise a VCSEL that emits on both sides, or it comprises a double heterostructure consisting of two VCSELs grown one directly above the other. In this case, each VCSEL part may comprise a corresponding resonator comprising two mirror pairs, for example DBR mirrors. In this case, the VCSELs of a surface emitter 10 may be designed such that they emit at different wavelengths, wherein the upper VCSEL, which radiates the electromagnetic radiation 2 in the direction of the second receiver 4, may be constituted in the material system GaAs, for example. Advantageously, the photodiodes 30 of the second receiver 4 are then likewise constituted in the material system GaAs, whereby the absorption of the photodiodes 30 is coordinated with the electromagnetic radiation 2 of the surface emitters 1.

The lower VCSEL, facing the first receiver 3, may then be constituted in the material system InGaAs, for example. The carrier 7 may then be for example a growth substrate which consists of or contains GaAs. The first receiver 3 comprises photodiodes 30 that are likewise formed in the material system InGaAs.

This embodiment is advantageous in particular on account of the increased efficiency of GaAs-based photodiodes. Further advantages afforded in the case of this embodiment are that the surface emitters 10 are cost-effective and a direct projection of the emission of the electromagnetic radiation 2 onto the photodiodes 30 may take place in two directions. A higher output voltage UO in conjunction with a small component size is possible as a result. Furthermore, the construction enables operation at two different wavelengths of the electromagnetic radiation 2.

Scattering of the electromagnetic radiation 2 in the carrier 7 is disadvantageously possible. A housing 8 is necessary for the mechanical connection of the components of the optoelectronic device and the photodiodes 30 of the first receiver 1 must have a smaller bandgap in order that the electromagnetic radiation 2 is not absorbed by the GaAs substrate. This necessitates photodiodes in the material system InGaAs or Si, which may result in efficiency losses.

Figure 2:
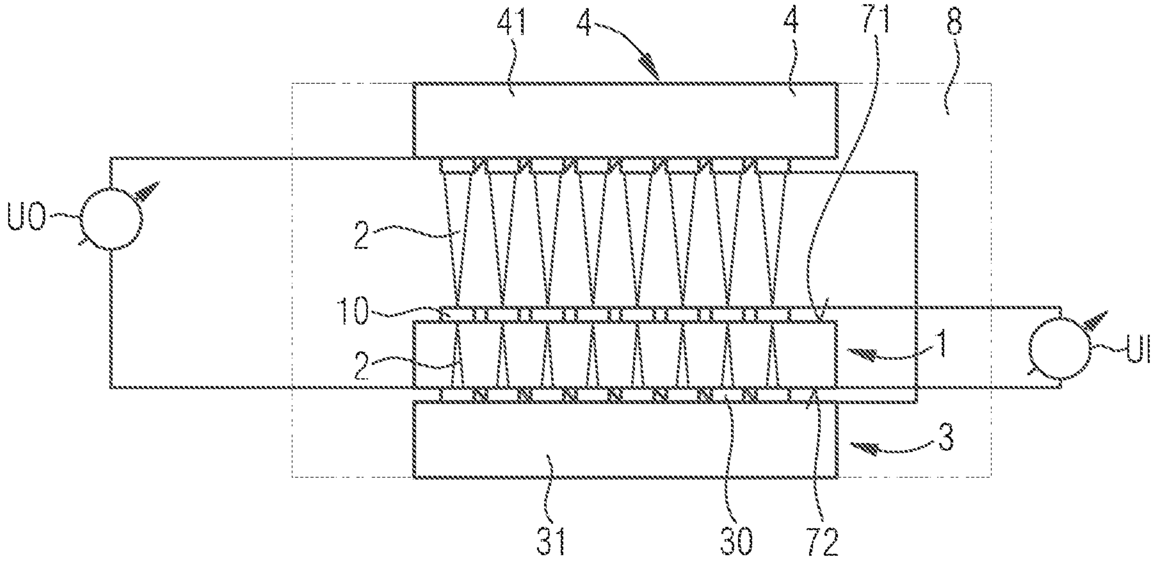
FIG. 2 schematically depicts an optoelectronic device according to an embodiment.

In association with the exemplary embodiment in FIG. 2, a description is given of an optoelectronic device in which, in contrast to the device in FIG. 1, there is direct contact between the first receiver 3 and the transmitter 1. For this purpose, the photodiodes 30 of the first receiver 3 are for example wafer-bonded to the carrier 7 at the bottom surface 72.

For this purpose, the carrier 7 is formed as electrically insulating in order to block the high electric fields which result from the potential difference between the output voltage UO and the input voltage UI. By way of example, the output voltage UO in this case is in the region of 1000 V and the input voltage is in the region of 3 V. Such electrical insulation may be achieved for example by virtue of the carrier 7 comprising an electrically insulating layer at its bottom surface 72, which layer may be constituted by an SiN layer having a thickness of a number of micrometers, for example. By way of example, the thickness of the layer is between at least 2 and at most 3 μm per 1000 V potential difference between the input voltage UI and the output voltage UO.

What is found to be disadvantageous about this embodiment is that electrical insulation of the carrier 7 is necessary. What is found to be advantageous is a facilitated alignment between the surface emitters 10 and the photodiodes 30 of the first receiver 3, and a reduced size in particular of the housing 8 as well.

Figure 3:
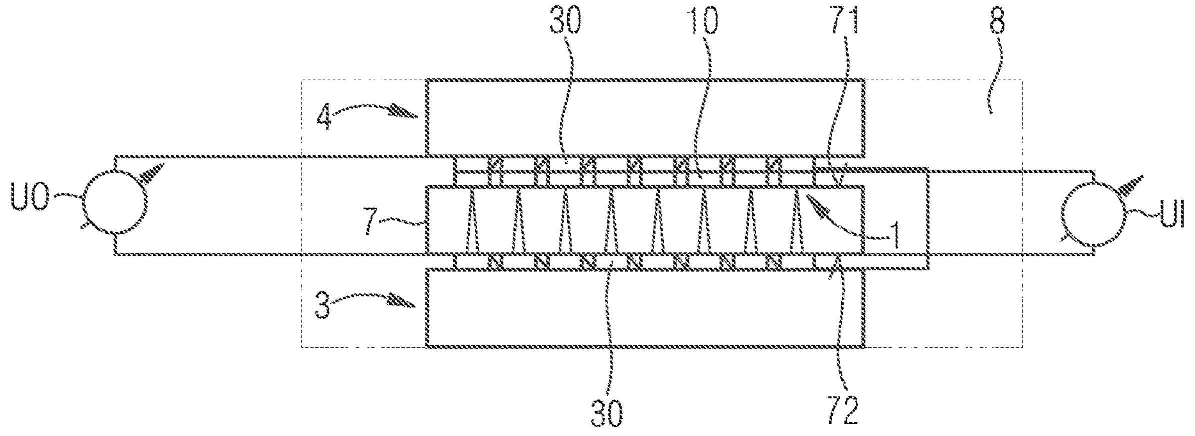
FIG. 3 schematically depicts an optoelectronic device according to an embodiment.

A further exemplary embodiment of an optoelectronic device described here is explained in greater detail in association with the schematic sectional illustration in FIG. 3. In contrast to the exemplary embodiment in FIG. 3, in this exemplary embodiment the photodiodes 30 of the second receiver 4 are also in direct contact with the transmitter 1.

For this purpose, the photodiodes 30 may be bonded to the respective surface emitters situated opposite, each of which is a VCSEL chip, for example. As a result, each photodiode 30 is aligned with the aperture of the surface emitter 10. This results in a further reduction in the size of the device, but requires sufficient electrical insulation between the surface emitters 10 and the photodiodes 30, for example a dielectric layer as described in relation to FIG. 2.

It proves to be advantageous that the two receivers 3, 4 and the transmitter 1 can be aligned at the wafer level. As a result, there is no need for alignment during introduction into a housing 8, which further reduces the outlay for production. What may be found to be disadvantageous is that electrical insulation between the surface emitters 10 and the photodiodes 30 of the second receiver 4 is necessary and interconnection of the individual surface emitters 10 and of the individual photodiodes 30 of the second receiver 2 is made more complicated in comparison with the exemplary embodiment in FIG. 2.

Figure 4:
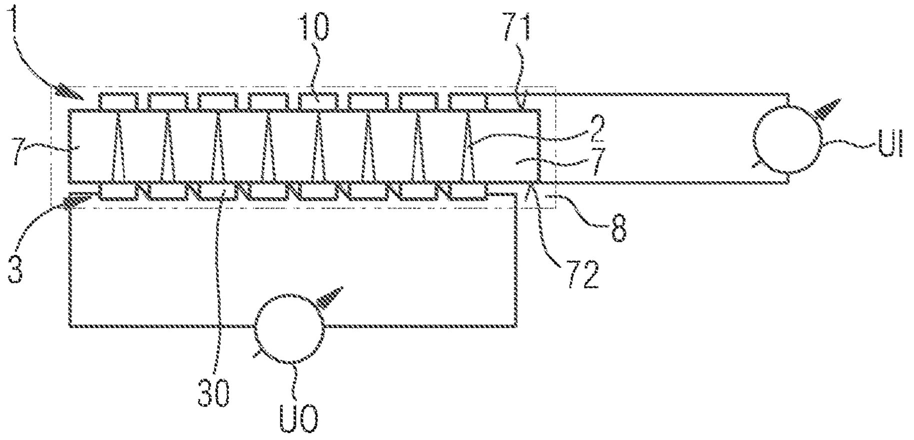
FIG. 4 schematically depicts an optoelectronic device according to an embodiment.

A further exemplary embodiment of a device described here is explained in greater detail in association with the schematic sectional illustration in FIG. 4. In contrast to the previous exemplary embodiments, the photodiodes 30 of the first receiver 3 in the exemplary embodiment in FIG. 4 are epitaxially applied to the carrier 7. Furthermore, it is possible for the surface emitters 10 also to be epitaxially grown on the carrier 7. In this case, only one receiver 3 is present in the exemplary embodiment in FIG. 4. However, it is possible to add further receivers, as is shown for example in association with the exemplary embodiments in FIGS. 1 to 3 and 5.

By way of example, the surface emitters 10 are firstly grown epitaxially onto the top surface 71 of the carrier 7. In the meantime, the bottom surface 72 of the carrier 7, on which the photodiodes 30 are epitaxially deposited later, may be protected by a first sacrificial layer, which is constituted with $SiO_2$, for example. The sacrificial layer is removed before the growth of the photodiodes 30, which may be covered by a further sacrificial and protective layer after growth.

During the growth of the photodiodes 30, the surface emitters 10 may be protected by a sacrificial layer constituted with InGaP or AlGaAs having a high aluminum content, for example. After growth, the surface emitters 10 and the photodiodes 30 are processed from both sides of the carrier 7. In order that the current paths for the surface emitters 10 and the photodiodes 30 are electrically insulated from one another, it is advantageous to introduce an epitaxially produced insulator between the carrier 7 and the photodiodes 30, which insulator may be constituted for example by an AlGaAs oxidation layer having a high aluminum content or by a superlattice having a thickness of at least 2.5 μm for a potential difference of 1000 V. This advantageously results in a particularly compact device that does not require wafer bonding. Furthermore, particularly low material costs arise during production since just a single growth substrate—the carrier 7—is used. However, particularly careful handling of the carrier 7 is necessary during production since the epitaxial growth takes place on both sides of the carrier.

Figure 5:
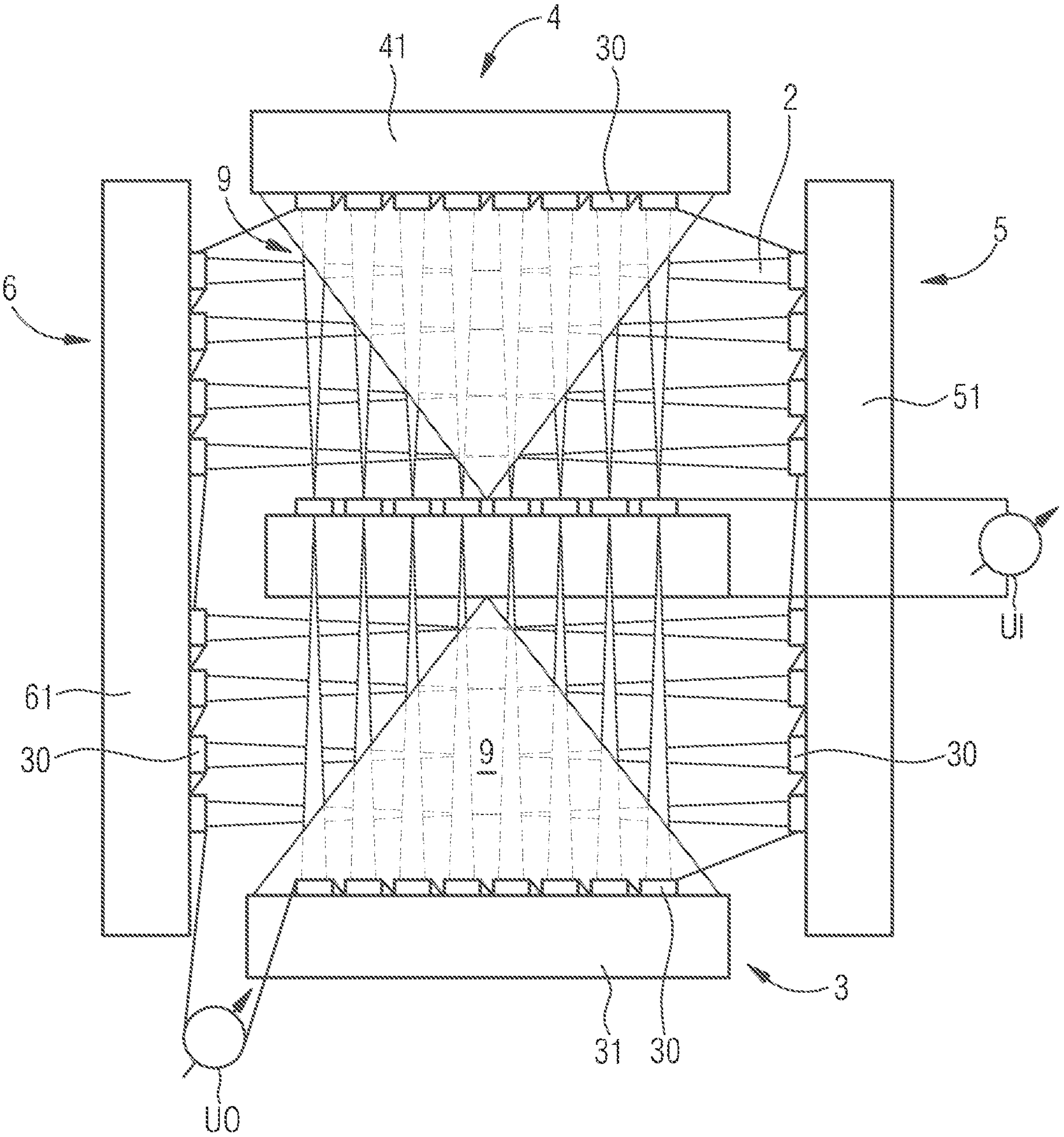
FIG. 5 schematically depicts an optoelectronic device according to an embodiment.

A further exemplary embodiment of a device described here is explained in greater detail in association with FIG. 5 on the basis of a schematic sectional illustration. In contrast to the exemplary embodiment in FIG. 1, for example, the device comprises a third receiver 5 comprising a third carrier 51 for the photodiodes 30 and a fourth receiver 6 comprising a fourth carrier 61 for the photodiodes 30, which are each arranged laterally with respect to the transmitter 1.

Moreover, beam splitters 9 are introduced into the housing 8, and are arranged between the transmitter 1 and respectively the first receiver 3 and the second receiver 4. The beam splitters deflect the electromagnetic radiation of the surface emitters 10 in different directions, for example by 90°. The beam splitters 9 may be formed in pyramidal fashion, for example.

The device may comprise further receivers (not illustrated), for example a fifth receiver and a sixth receiver, which are arranged in front of and behind the transmitter 1. All of the photodiodes 30 of all the receivers may be connected in series. For the mechanical stabilization of the device, the free space between the components of the device in the housing 8 may be filled with a transparent insulating material, such as, for example, a plastic such as silicone and/or an epoxy resin.

What is found to be advantageous is that a projection of the emission onto photodiodes 30 may take place in up to six directions, which yields a particularly compact component for the same number of photodiodes 30. In this case, high voltages in conjunction with a small structural size are possible and, as described in relation to FIG. 1, operation at two different wavelengths is also made possible. What is found to be disadvantageous is complex alignment in the housing 8.

Overall, a device described here enables large differences between the input voltage UI and the output voltage UO in conjunction with a particularly small component size. In the case of the components, use is made of surface emitters 10 that radiate part of their radiation through the carrier 7. For this purpose, the carrier 7 is formed so as to be transparent to the radiation generated in the surface emitter 10, which is possible for example for a surface emitter in the material system InGaAs on a GaAs substrate for an InGaN-based surface emitter on a GaN/sapphire substrate.

If the surface emitter used is for example an emitter in the material system InGaAlP that is grown on GaAs as growth substrate, then this growth substrate is not transparent to the electromagnetic radiation generated. In this case, the growth substrate may be detached and replaced by a transparent carrier 7. For efficiency reasons, the space between adjacent photodiodes 30 should not be illuminated since this radiation 2 would otherwise not contribute to the voltage conversion. Dividing the electromagnetic radiation 2 of the surface emitters among a plurality of receivers proves to be particularly advantageous with the use of high-power VCSELs as surface emitters 10, since for the latter the optical power of a surface emitter 10 would exceed the required intensity for the saturation of a photodiode 30.

The invention is not restricted to the exemplary embodiments by the description on the basis thereof. Rather, the invention encompasses any novel feature and also any combination of features, which includes in particular any combination of features in the patent claims, even if this feature or this combination itself is not explicitly specified in the patent claims or exemplary embodiments.

The invention claimed is:

1. An optoelectronic device comprising:

a transmitter configured to emit electromagnetic radiation and to be operated with an input voltage, a carrier for the transmitter, which comprises a top surface and a bottom surface, and a first receiver and a second receiver, each configured to receive at least part of the electromagnetic radiation and to supply at least part of an output voltage, wherein the input voltage is greater than the output voltage and the transmitter comprises a plurality of surface emitters interconnected in series with one another, the plurality of surface emitters of the transmitter are secured to the top surface of the carrier and radiate at least part of the electromagnetic radiation through the carrier, the first receiver and the second receiver each comprise at least one photodiode, the first receiver is arranged at the bottom surface of the carrier, and the second receiver is arranged at the top surface of the carrier.

2. The optoelectronic device as claimed in claim 1, wherein the first receiver and/or the second receiver comprises a plurality of photodiodes interconnected at least partly in parallel with one another.

3. The optoelectronic device as claimed in claim 1 comprising further receivers configured to receive part of the electromagnetic radiation and to supply part of an output voltage, wherein each further receiver comprises at least one photodiode.

4. The optoelectronic device as claimed in claim 1, wherein the transmitter and the second receiver are in direct contact with one another.

5. The optoelectronic device as claimed in claim 1 comprising a third receiver and/or a fourth receiver and/or a fifth receiver and/or a sixth receiver, which are arranged laterally with respect to the transmitter.

6. The optoelectronic device as claimed in claim 5, wherein a radiation splitter is disposed downstream of the transmitter at the top surface and/or the bottom surface of the carrier.

7. The optoelectronic device as claimed in claim 1, wherein the first receiver is in direct contact with the carrier.

8. The optoelectronic device as claimed in claim 1, wherein the at least one photodiode of the first receiver is bonded to the bottom surface of the carrier.

9. The optoelectronic device as claimed in claim 1, wherein the at least one photodiode of the first receiver is epitaxially grown on the bottom surface of the carrier.

10. The optoelectronic device as claimed in claim 1, wherein the at least one of the plurality of surface emitters of the transmitter is epitaxially grown on the top surface of the carrier.

11. The optoelectronic device as claimed in claim 1, wherein the at least one photodiode of the first receiver is epitaxially grown on the bottom surface of the carrier and the at least one of the plurality of surface emitters of the transmitter is epitaxially grown on the top surface of the carrier.

* * * * *